(12) United States Patent
Lin et al.

(10) Patent No.: US 6,746,925 B1
(45) Date of Patent: Jun. 8, 2004

(54) HIGH-K DIELECTRIC BIRD'S BEAK OPTIMIZATIONS USING IN-SITU $O_2$ PLASMA OXIDATION

(75) Inventors: Hong Lin, Vancouver, WA (US); Shiqun Gu, Vancouver, WA (US); Wai Lo, Lake Oswego, OR (US); Jim Elmer, Vancouver, WA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/397,451

(22) Filed: Mar. 25, 2003

(51) Int. Cl.[7] .................. H01L 21/336; H01L 21/3205; H01L 21/8238; H01L 21/36
(52) U.S. Cl. .................. 438/287; 438/303; 438/595; 438/225; 438/230; 438/504; 438/452
(58) Field of Search .................. 438/303, 585, 438/595, 772, 287

(56) References Cited

U.S. PATENT DOCUMENTS

| | | | | |
|---|---|---|---|---|
| 4,323,589 A | * | 4/1982 | Ray et al. .................. 427/539 |
| 4,758,530 A | * | 7/1988 | Schubert .................. 438/452 |
| 4,869,781 A | * | 9/1989 | Euen et al. .................. 438/287 |
| 4,876,983 A | * | 10/1989 | Fukuda et al. .................. 118/722 |
| 4,925,807 A | * | 5/1990 | Yoshikawa .................. 438/304 |
| 4,963,502 A | * | 10/1990 | Teng et al. .................. 438/225 |
| 5,073,516 A | * | 12/1991 | Moslehi .................. 438/429 |
| 5,162,633 A | * | 11/1992 | Sonobe et al. .................. 219/121.43 |
| 5,476,802 A | * | 12/1995 | Yamazaki et al. .................. 438/307 |
| 5,712,204 A | * | 1/1998 | Horiuchi .................. 438/307 |
| 5,776,821 A | * | 7/1998 | Haskell et al. .................. 438/585 |
| 5,840,611 A | * | 11/1998 | Lee et al. .................. 438/307 |
| 6,087,238 A | * | 7/2000 | Gardner et al. .................. 438/304 |
| 6,204,130 B1 | * | 3/2001 | Gardner et al. .................. 438/287 |
| 6,368,941 B1 | * | 4/2002 | Chen et al. .................. 438/424 |

\* cited by examiner

Primary Examiner—John F. Niebling
Assistant Examiner—Ron Pompey
(74) Attorney, Agent, or Firm—Beyer Weaver & Thomas, LLP

(57) ABSTRACT

In a method of forming an integrated circuit device, sidewall oxides are formed by plasma oxidation on the patterned gate. This controls encroachment beneath a dielectric layer underlying the patterned gate. The patterned gate is oxidized using in-situ $O_2$ plasma oxidation. The presence of the sidewall oxides minimizes encroachment under the gate edge.

19 Claims, 2 Drawing Sheets

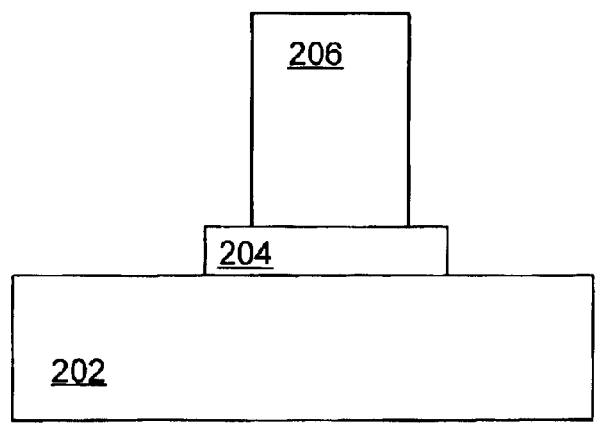
FIG. 2D
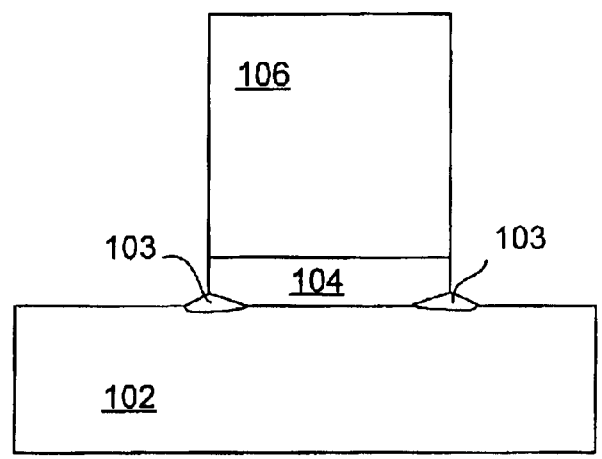
FIG. 1    (PRIOR ART)

HIGH-K DIELECTRIC BIRD'S BEAK OPTIMIZATIONS USING IN-SITU O₂ PLASMA OXIDATION

BACKGROUND OF THE INVENTION

1. Field of the Invention

The present invention relates to processes for fabricating semiconductor devices. More particularly, the present invention relates to the use of plasma oxidation to reduce lateral encroachment during the fabrication processes.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface.

As the scaling of the Metal Oxide Semiconductor (MOS) transistor proceeds toward deep sub-micron dimensions, high-k gate dielectric materials (which are defined as materials that can provide a k value significantly higher than that of $SiO_2$) are becoming more predominant in replacing silicon dioxide ($SiO_2$) as a gate dielectric. One problem with $SiO_2$ gate dielectrics is excessive leakage current at the sub-90 nm process nodes.

However, one of the issues related to using high-k materials as gate dielectrics is the formation of bird's beak encroachment at the corner edge of the gate stack due to lateral encroachment of the formed $SiO_2$ under the high-k material. The bird's beak encroachment typically has a tapered shape. The formation of the $SiO_2$ bird's beak directly under the corner of the gate electrode (such as Poly-Si) will significantly reduce the effective k-value and thereby increase the gate equivalent oxide thickness (EOT). Such bird's beak encroachment is thus unacceptable for CMOS transistor manufacturing.

Conventional approaches to mitigating the encroachment include physical sputter etching of high-k dielectrics. The sputter etching will re-deposit high-k dielectric into the sidewall of the gate stack to minimize the high-k dielectric's etch undercut, and thus, reduce the high-k dielectric's bird's beak formation directly under the gate electrode. However, it is difficult to control the thickness of the re-deposited layer of high-k dielectric. Moreover, it may not be possible to completely eliminate the $SiO_2$ encroachment directly under gate electrode with this technique.

Accordingly, it is desirable to provide a more effective process for controlling the $SiO_2$ encroachment from directly under the active gate electrode.

SUMMARY OF THE INVENTION

To achieve the foregoing, the present invention provides a process that provides increased control of gate sidewall oxide layers and prevents oxide encroachment from being formed under the gate electrode. The poly gate electrode layer is deposited and etched, with the etching stopping on the high-k material layer. Oxidation of the sidewall of the gate electrode stack is achieved using in-situ $O_2$ plasma oxidation. Thus, the sidewall oxide thickness can be controlled by varying the $O_2$ plasma and oxidation time parameters. A high-k dielectric layer etch follows using plasma dry etching, thus avoiding etching of the high-k material under the sidewall due to the anisotropic nature of the plasma etch.

In one embodiment, the present invention provides a process for forming a gate dielectric while minimizing lateral encroachment of a $SiO_2$ layer. A dielectric layer is deposited on a substrate. A gate electrode layer is formed on the dielectric layer. The gate electrode layer is patterned and etched. An oxidized layer is formed on the sidewalls of the gate electrode stack using plasma oxidation. The exposed oxidized layer is then etched using a plasma dry etch. The plasma oxidized areas are then removed.

In another embodiment, thickness of the oxidized layer is controlled by controlling to a predetermined value at least one of the oxidation time and plasma process parameters. Control of the plasma oxidation is further obtained by applying a higher RF power to the top portion of a plasma reactor while applying a lower RF value to the bottom portion of the plasma reactor.

In yet another embodiment, the dielectric layer is one of hafnium oxide, hafnium silicate, aluminum oxide, zirconium oxide, and other metal oxides that contain one, two or even more cations and nanolaminate layers.

These and other features and advantages of the present invention are described below with reference to the drawings.

BRIEF DESCRIPTION OF THE DRAWINGS

FIG. 1 is a diagram illustrating a gate electrode stack having $SO_2$ encroachment as found in conventional systems.

FIGS. 2A–2D are diagrams illustrating stages in the process of forming a semiconductor integrated circuit gate stack structure in accordance with one embodiment of the present invention.

DETAILED DESCRIPTION OF PREFERRED EMBODIMENTS

Figure 2A:
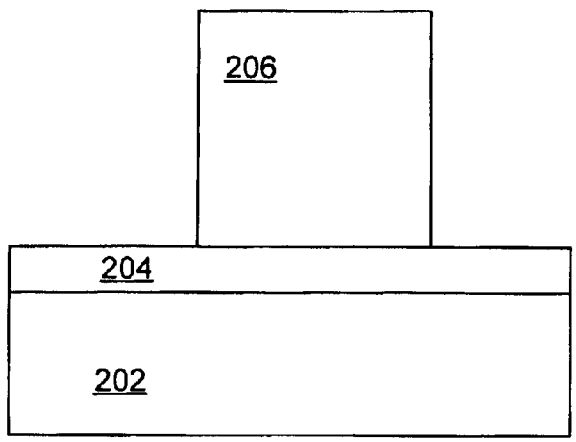

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides in one embodiment a process that provides increased active process control of the thickness of the sidewall oxide formed on the sidewalls of the gate. The poly gate electrode layer is first deposited and etched, with the etching stopped on the high-k material layer. Oxidation of the sidewall of the gate electrode stack is achieved using in-situ $O_2$ plasma oxidation. Thus, the sidewall oxide thickness can be controlled by selecting the $O_2$ plasma and oxidation time parameters. A high-k dielectric layer etch follows using plasma dry etching, thus avoiding etching of the high-k material under the sidewall. With this process, active control of the relative locations of the high-k dielectric's edge to gate electrode is effectuated and thus, the $SiO_2$ encroachment can be moved from directly under the active gate electrode.

FIG. 1 is a diagram illustrating a gate electrode stack having $SiO_2$ encroachment as found in conventional systems. This lateral encroachment 103, which is also typically referred to as "bird's beak" encroachment, is demonstrated under the dielectric layer 104 and into the active device region of the substrate 102. The bird's beak encroachment is formed directly under the gate electrode 106 and thus reduces the dielectric constant of the dielectric layer between the gate electrode and the active device regions. That is, the permittivity (k) of the $SiO_2$ is less than that of a typical high-k dielectric material. High-k materials, for example, are typically described as having k values greater than 3.9, which is the k value of $SiO_2$.

The lateral encroachment of the dielectric layer 104 effectively increases the effective oxide thickness (EOT) of the gate stack in the locations where the encroachment is present. This undermines the effectiveness of the high-k layer. As device miniaturization continues, gate dielectric materials with higher permittivity values are selected because they can be deposited in thicker layers (and thereby avoiding electron tunneling and other problems) while retaining the electrical characteristics of a thinner gate dielectric layer. Unfortunately, the presence of the lateral encroachment reduces the advantages of the high-k layer by reducing the overall dielectric constant of the layer combining the high-k and encroachment regions.

Embodiments of the present invention avoid the impact of the "bird's beak" encroachment and the resulting reduction in the overall k value of the gate stack by using plasma oxidation to form a sidewall to the gate stack and thereby to move any $SiO_2$ encroachment from under the gate electrode. That is, the formation of plasma oxidized spacers in an oxidation process allows active control of the sidewall oxide thickness and thus, active control of the relative locations of the high-k dielectric layer edge relative to the gate electrode edge.

FIGS. 2A–2D are diagrams illustrating stages in the process of forming a semiconductor integrated circuit gate stack structure in accordance with one embodiment of the present invention. The process commences as illustrated in FIG. 2A with a high-k dielectric layer 204 formed on a substrate 202, typically Si. The high-k layer 204 may be deposited by any of a variety of techniques for depositing dielectric layers as known to those of skill in the art. For example, a high-k layer such as $HfO_2$ may be deposited by CVD techniques. Alternatively, the high-k layer may be deposited by other techniques known to those of skill in the art including ALD (atomic layer deposition), PECVD (plasma enhanced chemical vapor deposition), and MOCVD (metal-organic chemical vapor deposition). Preferably, the high-k layer is a dielectric having a dielectric constant value k greater than 3.9. Although the high-k layer 204 has been described as composed of $HfO_2$ for illustration purposes, the invention is not so limited. For example, other suitable high-k materials for use with the present invention also include hafnium silicate, silicon nitride, and other metal oxides that contain either one, two, or even more cations. Insulating dielectrics may also be composed of nanolaminates instead of selecting a single high-k material. Nanolaminates are generally stacks of multiple, typically different, materials, each material layer comprising an ultra thin film such as formed by atomic layer deposition methods.

Next, a polysilicon or amorphous silicon gate layer 206 is deposited and patterned to form gate 206. Deposition of the polysilicon or amorphous silicon layer may occur by techniques well known to those of skill in the relevant art. For example, poly silicon layers are conventionally formed by depositing silicon layers, for example, by conventional deposition methods such as for example, chemical vapor deposition (CVD), followed by patterning and etching. The patterning is conventionally performed by depositing a photo resist layer, forming a photo resist mask by transferring an image from a reticle to the photoresist layer, and making use of the actinic properties of the photo resist layer, dissolving away non-reactive portions of the photo resist layer to form the mask. Using the mask so formed, portions of the gate layer may be removed by etching to define the gate 206. That is, a conventional poly etch may be performed.

Although described above as preferably formed from Poly-Si, the gate 206 may also be formed from alternative materials For example, the gate layer may comprise Poly-SiGe. A conventional Poly-Si or Poly-SiGe gate etch may be performed, stopping on the dielectric layer 204. The details as to performing conventional Poly-Si or Poly-SiGe etches are known to those of skill in the art and therefore complete details will not be provided here. Conventional poly etch process steps provide high selectivity to high-k dielectric materials such as the $HfO_2$ layer illustrated and described herein. For example, a larger than 100:1 Poly-Si to $HfO_2$ selectivity has been estimated during the Poly-Si over etch step.

Figure 2B:
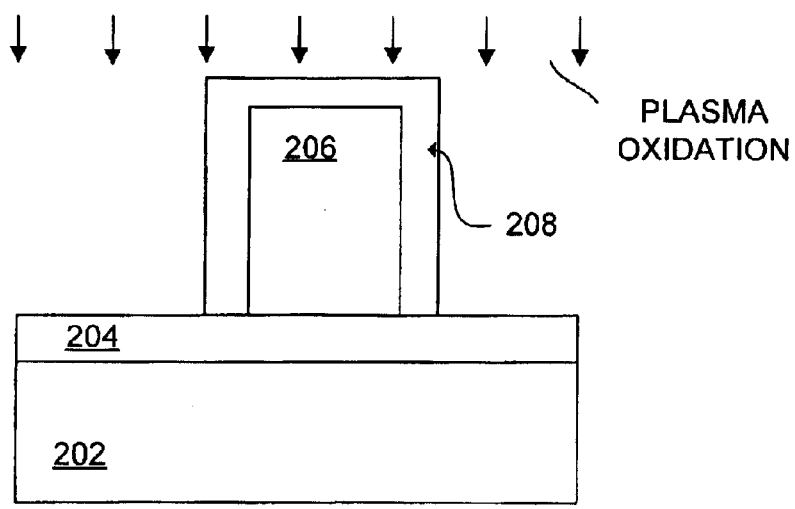

Next, as illustrated in FIG. 2B, the partially formed stack structure is oxidized by plasma oxidation to form a $SO_2$ sidewall 208. The plasma oxidation step is preferably an in-situ $O_2$ oxidation step. That is, the oxidation process steps occur without the removal of the substrate from the processing tool. Important process parameters that influence the oxidation rate include plasma power, process chamber pressure, and substrate temperature. This $O_2$ plasma based process is applicable to the fabrication of sidewall oxides on all patterned gates. The final sidewall oxide thickness is controlled by controlling the plasma process parameters and oxidation time. As a result, accurate control over the thickness of the oxidized layer may be achieved. For example, in one embodiment, the patterned gate is preferably exposed to the plasma oxidation for a period in the range from 15 to 120 seconds Plasma oxidation may be performed in microwave, RF, and DC plasmas with a variety of reactor configurations and a range of ion plasma densities. The sidewall oxide growth rates are accelerated by the plasma-enhanced generation of reactive chemical species or by the presence of electric fields to aid charged-particle transport during plasma processes. In one embodiment, in order to form a uniform sidewall with a controlled thickness, the plasma process parameters are preferably set so that a high top RF power and a low bottom RF power is applied.

While the plasma oxidation is generally described herein using a parallel plate plasma reactor, the invention is not so limited. Alternative plasma sources and methods include inductive coupling and microwave plasma. A typical frequency used in plasma generation for semiconductor processing is 13.6 MHz. For example, downstream plasma methods may be such as including a microwave plasma generation source and inductive coupling to transfer the plasma charges to the sample. In the downstream plasma process, the wafer is typically located away from plasma, and hence, is not directly exposed to plasma. In one embodiment, plasma etching methods may be performed by using high-density plasma generated using Electron Cyclotron Resonance. Microwave plasma offers yet another plasma processing method in another embodiment whereby the plasma is generated using a microwave frequency signal, typically at 2.45 GHz.

Plasma oxidation may be performed using any of several commercially available plasma dry etching and resist stripping tools such as a conventional Lam TCP9400PTX provided by Lam Research Corporation of Fremont, Calif. The exposure of patterned gate 206 to the plasma oxidation may be carried out at relatively low temperatures, i.e., at a temperature ranging from about 40 C. to about 80 C., and preferably about 60 C. to about 70 C., although higher temperatures, e.g., as high as 200 C., may be used, if desired. The step of exposing the Poly-Si or Poly-SiGe gate 206 to the oxygen plasma may be carried out in a conventional etching chamber at a pressure low enough to permit plasma generation. A pressure ranging from about 20 milliTorr (mTorr) to about 80 mTorr is preferred.

The use of a 100–1000 watt RF plasma source, for example, in combination with an RF bias power of about 0–20 watts electrically coupled to the substrate support in the plasma chamber, will provide the desired amount of energy to the plasma ions to permit the oxidant to form on the gate-sidewall interface at a controlled and preferable rate.

The RF power for the top electrode is preferably set in the range of 100 to 350 watts and the bottom RF electrode is set at an RF power of 0 to 20 watts. By using the low RF bottom power, the energized O+ ions are prevented from implanting into the Si substrate 202. This minimizes the potential Si recess that might otherwise form in the source/drain regions. Preferably, the plasma-oxidized sidewall 208 will range from 3 to 10 nm in thickness, although this range could be extended depending upon the process used. The gate length and sidewall oxidation thickness can be adjusted to achieve the required final gate length.

Formation of the plasma-oxidized sidewall will effectively move the locations of any subsequently formed "bird's beak" encroachments from directly under the gate to a more benign location. That is, the thickness of the sidewall 208 may be selected to correspond to the expected lateral penetration of lateral $SiO_2$ encroachment under the gate in the absence of the sidewall oxide. Preferably, an additional margin is provided in selecting the sidewall oxide thickness to ensure that the lateral "bird's beak" encroachment does not fall directly under the gate electrode 206.

Figure 2C:
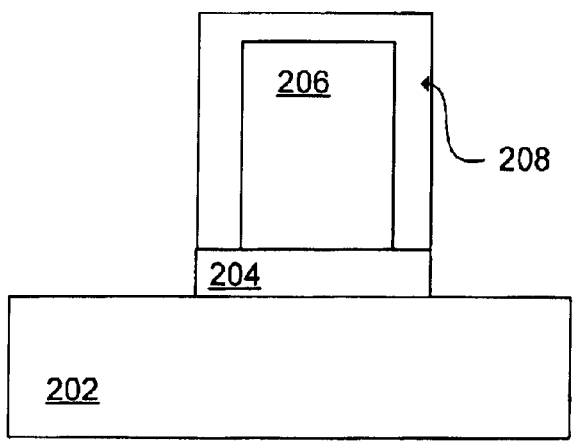

While not wishing to be bound by any particular theory, it is believed that high-k dielectric layers are relatively unstable at high temperatures. This instability leads to the creation of interfacial layers between the high k and the silicon substrate. Next, as illustrated in FIG. 2C, the exposed high-k dielectric layer 204 is etched preferably using plasma dry etching. The plasma dry etching process parameters may be set to values within a wide range of suitability and still be in keeping with the spirit and scope of the present invention. That is, the high k dielectric etch may be effectuated using a pure sputtering etch or a more chemical etch or any range in between without departing from the spirit and scope of the present invention. Due to the anisotropic properties of the plasma dry etch, the high-k layer under the sidewall 208 will not be etched or will be minimally etched. Selection of chemicals for use in the plasma dry etch are known to those of skill in the relevant art and further are process dependent. For example, plasma sputter etching may be performed using Argon or Nitrogen gas, and more chemical etch may be performed using suitable combinations of one or more of the following process species: chlorine, hydrogen bromide, oxygen, helium, and fluorine based chemistries such as $CF_4$, $C_2F_6$, $CH_3F$, $CHF_3$, and $CH_2F_2$. Finally, as shown if FIG. 2D, an HF cleaning step is performed to remove all high-k dielectric residue and to remove the $SiO_2$ sidewall.

The process as described permits active control of the sidewall oxide thickness and thus, actively controls the relative locations of the high-k dielectric's edge to the gate electrode edge. As a result, the $SiO_2$ "bird's beak" encroachment may be moved from directly under the gate electrode laterally to a point where the encroachment does not adversely affect device operation.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a semiconductor integrated circuit, the method comprising:

forming a dielectric layer on a substrate;

forming a gate conductive layer on the dielectric layer;

patterning and etching the gate conductive layer to form a gate electrode;

oxidizing the gate electrode using plasma oxidation to form a sidewall oxide;

etching the dielectric layer selectively such that a first region of the dielectric layer directly under the sidewall oxide is not etched; and removing the sidewall oxide after etching the dielectric layer.

2. The method as recited in claim 1 wherein etching of the dielectric layer is performed using an anisotropic etch.

3. The method as recited in claim 1 wherein etching of the dielectric layer is performed using a plasma etch.

4. The method as recited in claim 1 wherein the thickness of the sidewall oxide formed is controlled by adjusting at least one of the oxidation time and plasma oxidation parameters.

5. The method as recited in claim 1 wherein the gate electrode is exposed to the plasma oxidation for a period in the range from 15 to 120 seconds.

6. The method as recited in claim 1 wherein thickness of the sidewall oxide formed is controlled by adjusting at least one of the plasma power, process chamber pressure, and substrate temperature.

7. The method as recited in claim 1 wherein the sidewall oxide thickness lies in the range from 3 nm to 10 nm.

8. The method as recited in claim 1 wherein the plasma oxidation occurs using an RF power source in the range of 100–1000 watts and an RF bias power source in the range of 0 to 20 watts coupled to the substrate support.

9. The method as recited in claim 1 wherein the plasma oxidation is performed by applying a higher RF power to the top RF electrode in the plasma process chamber and a lower bias RF power to the bottom electrode that is supporting the substrate.

10. The method as recited in claim 9 wherein the RF power applied to the top electrode lies in the range of 100–300 watts and the bias RF power applied to the bottom electrode lies in the range of 0–20 watts.

11. The method as recited in claim 1 wherein the plasma oxidation step is performed in-situ.

12. The method as recited in claim 9 wherein the RF power applied to the top electrode and the bias RF power applied to the bottom electrode are selected such that the ions from the plasma oxidation are not implanted into the substrate.

13. The method as recited in claim 1 wherein the dielectric layer is a high-k layer.

14. The method as recited in claim 1 wherein the dielectric layer comprises one of hafnium oxide, hafnium silicate, silicon nitride, and other metal oxides that contain at least one cation.

15. The method as recited in claim 1 wherein the dielectric layer comprises a nanolaminate.

16. The method as recited in claim 1 wherein the dielectric layer comprises zirconium oxide.

17. The method as recited in claim 1 wherein the gate is comprised of one of Poly-Si, amorphous Si, or Poly-SiGe.

18. The method as recited in claim 1 wherein the thickness of the sidewall oxide is selected to correspond to an expected penetration distance for lateral $SiO_2$ encroachment under the dielectric layer and into the substrate.

19. A method of forming a semiconductor integrated circuit, the method comprising:

forming a high-k dielectric layer on a substrate;

defining a gate electrode on the high-k dielectric layer;

forming a sidewall oxide on the gate electrode, the thickness of the sidewall oxide selected to correspond to an expected lateral penetration distance for $SiO_2$ bird's beak encroachment under the high-k dielectric layer;

etching the high-k dielectric layer selectively such that a first region of the high-k dielectric layer directly under the sidewall oxide is not etched; and removing the sidewall oxide after etching the high-k dielectric layer.

* * * * *